(12) United States Patent
Zeng et al.

(10) Patent No.: US 11,133,357 B2
(45) Date of Patent: Sep. 28, 2021

(54) DRIVE CIRCUIT ARRANGEMENT FOR DISPLAY PANEL AND DISPLAY DEVICE

(71) Applicant: Shanghai Tianma Micro-Electronics Co., Ltd., Shanghai (CN)

(72) Inventors: Yang Zeng, Shanghai (CN); Feng Lu, Shanghai (CN); Haochi Yu, Shanghai (CN); Xiaoyue Su, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 231 days.

(21) Appl. No.: 16/541,856

(22) Filed: Aug. 15, 2019

(65) Prior Publication Data
US 2020/0343320 A1    Oct. 29, 2020

(30) Foreign Application Priority Data
Apr. 29, 2019    (CN) .......................... 201910357149.8

(51) Int. Cl.
| | |
|---|---|
| *H01L 27/32* | (2006.01) |
| *G06K 9/00* | (2006.01) |
| *H01L 27/146* | (2006.01) |

(52) U.S. Cl.
CPC ........ *H01L 27/3234* (2013.01); *G06K 9/0004* (2013.01); *H01L 27/326* (2013.01); *H01L 27/3246* (2013.01); *H01L 27/3248* (2013.01); *H01L 27/3272* (2013.01); *H01L 27/3276* (2013.01); *H01L 27/14678* (2013.01)

(58) Field of Classification Search
CPC ............. H01L 27/3234; H01L 27/3246; H01L 27/3248; H01L 27/326; H01L 27/3272; H01L 27/3276; H01L 27/14678; H01L 27/3258; H01L 27/3218; H01L 27/3262; G06K 9/0004
USPC .......................................................... 257/40
See application file for complete search history.

(56) References Cited

U.S. PATENT DOCUMENTS

2020/0381492 A1*    12/2020    Ryu .................... H01L 27/3246

FOREIGN PATENT DOCUMENTS

CN            108122950 A        6/2018

\* cited by examiner

*Primary Examiner* — Lex H Malsawma
*Assistant Examiner* — Gardner W. S. Swan
(74) *Attorney, Agent, or Firm* — Anova Law Group, PLLC

(57) ABSTRACT

Display panel and display device are provided. The display panel includes fingerprint recognition units, a substrate, drive circuits, and organic light-emitting units. A distance between two adjacent drive circuits in each drive circuit group is less than a distance between two adjacent drive circuits in two adjacent drive circuit groups along a first direction. The drive circuits from a first row to an i-th row is a first drive circuit, and the drive circuits from a j-th row to an M-th row is a second drive circuit. A first direction component, along the first direction, of each of vias that correspond to at least a portion of the first drive circuit pointing to a first corresponding electrically-connected anode, and a second direction component, along the first direction, of each of vias that correspond to at least a portion of the second drive circuit pointing to a second corresponding electrically-connected anode, are opposite components.

20 Claims, 9 Drawing Sheets

DRIVE CIRCUIT ARRANGEMENT FOR DISPLAY PANEL AND DISPLAY DEVICE

CROSS-REFERENCE TO RELATED APPLICATION

This application claims the priority of Chinese Patent Application No. 201910357149.8, filed on Apr. 29, 2019, the content of which is incorporated herein by reference in its entirety.

TECHNICAL FIELD

The present disclosure generally relates to the field of fingerprint recognition technology and, more particularly, relates to a display panel and a display device.

BACKGROUND

As fingerprints are unique to each individual, fingerprint recognition functions have been used in a variety of display devices, such as mobile phones, tablets, smart wearable devices, and the like. As such, before operating the display devices with fingerprint recognition functions, users may only need to touch fingerprint recognition modules of the display devices with fingers to perform authorization and verification, which may simplify the authorization and verification process.

Conventional display devices with fingerprint recognition functions may be configured with multiple imaging apertures. Light emitted from a light-emitting layer may be reflected by the fingers to form images through the apertures.

There is a need to provide a display panel and a display device having sufficient space to configure the imaging apertures.

SUMMARY

One aspect of the present disclosure provides a display panel. The display panel includes a substrate, a plurality of drive circuits, and a plurality of organic light-emitting units, which are stacked sequentially, and further includes a light-blocking layer and a plurality of fingerprint recognition units. The plurality of drive circuits and the plurality of organic light-emitting units are electrically connected in a one-to-one correspondence, and anodes of the plurality of organic light-emitting units are electrically connected to the drive circuits through vias. The plurality of drive circuits is divided into a plurality of drive circuit groups, where each drive circuit group includes multiple drive circuits arranged in an array, and the anodes of the plurality of organic light-emitting units are evenly arranged. A distance between two adjacent drive circuits in each drive circuit group is less than a distance between two adjacent drive circuits in two adjacent drive circuit groups along a first direction. The drive circuit group includes M rows of the drive circuits along the first direction, where the drive circuits from a first row to an i-th row is a first drive circuit, the drive circuits from a j-th row to an M-th row is a second drive circuit, and $1 \leq i ? j \leq M$. A first direction component, along the first direction, of each of vias that correspond to at least a portion of the first drive circuit pointing to a first corresponding electrically-connected anode, and a second direction component, along the first direction, of each of vias that correspond to at least a portion of the second drive circuit pointing to a second corresponding electrically-connected anode, are opposite components; and the first direction is a row direction of the drive circuits arranged in an array. A plurality of imaging apertures is formed at the light-blocking layer; vertical projections of the imaging apertures on a film layer having the plurality of drive circuits are between the two adjacent drive circuit groups. The fingerprint recognition units are on a side of the light-blocking layer away from the organic light-emitting units, and light reflected by a touch body enters the fingerprint recognition units through the imaging apertures.

Another aspect of the present disclosure provides a display device including the above-mentioned display panel. The display panel includes a substrate, a plurality of drive circuits, and a plurality of organic light-emitting units, which are stacked sequentially, and further includes a light-blocking layer and a plurality of fingerprint recognition units. The plurality of drive circuits and the plurality of organic light-emitting units are electrically connected in a one-to-one correspondence, and anodes of the plurality of organic light-emitting units are electrically connected to the drive circuits through vias. The plurality of drive circuits is divided into a plurality of drive circuit groups, where each drive circuit group includes multiple drive circuits arranged in an array, and the anodes of the plurality of organic light-emitting units are evenly arranged. A distance between two adjacent drive circuits in each drive circuit group is less than a distance between two adjacent drive circuits in two adjacent drive circuit groups along a first direction. The drive circuit group includes M rows of the drive circuits along the first direction, where the drive circuits from a first row to an i-th row is a first drive circuit, the drive circuits from a j-th row to an M-th row is a second drive circuit, and $1 \leq i < j \leq M$. A first direction component, along the first direction, of each of vias that correspond to at least a portion of the first drive circuit pointing to a first corresponding electrically-connected anode, and a second direction component, along the first direction, of each of vias that correspond to at least a portion of the second drive circuit pointing to a second corresponding electrically-connected anode, are opposite components; and the first direction is a row direction of the drive circuits arranged in an array. A plurality of imaging apertures is formed at the light-blocking layer; vertical projections of the imaging apertures on a film layer having the plurality of drive circuits are between the two adjacent drive circuit groups. The fingerprint recognition units are on a side of the light-blocking layer away from the organic light-emitting units, and light reflected by a touch body enters the fingerprint recognition units through the imaging apertures.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure. Drawings incorporated in the specification and forming part of the specification demonstrate embodiments of the present disclosure and, together with the specification, describe the principles of the present disclosure.

DETAILED DESCRIPTION

Figure 1:
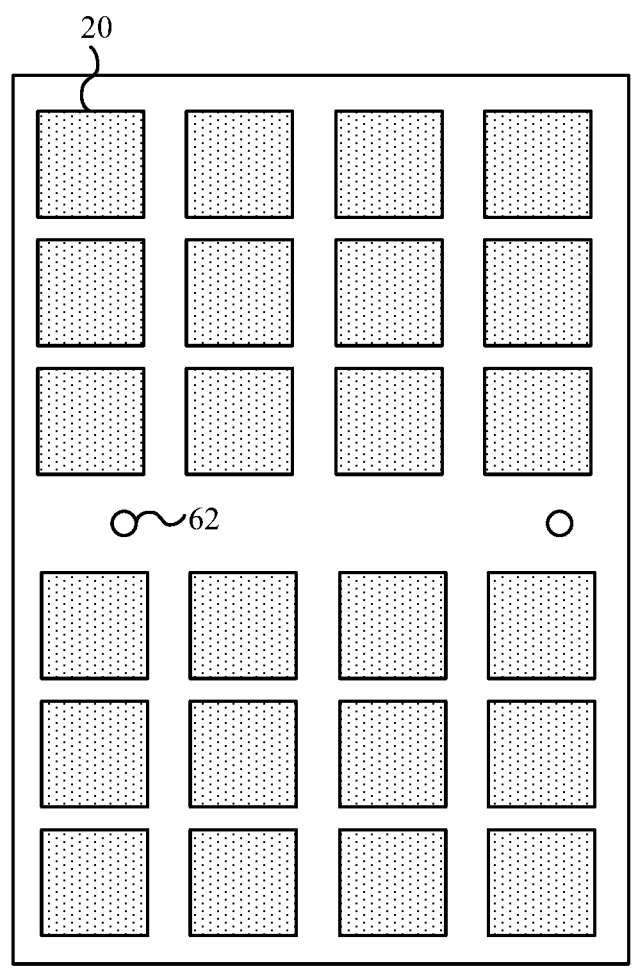
FIG. 1 illustrates a schematic of a drive circuit compression.

Reference will now be made in detail to exemplary embodiments of the disclosure, which are illustrated in the accompanying drawings. Wherever possible, the same reference numbers will be used throughout the drawings to refer to the same or like parts.

Various exemplary embodiments of the present disclosure will be described in detail with reference to the drawings. It should be noted that the relative arrangements of components and steps, numerical expressions and numerical values set forth in the embodiments are not intended to limit the scope of the present disclosure unless otherwise specified.

The following description of at least one exemplary embodiment is merely illustrative, and not as any limitations on the present disclosure and its application or use.

Techniques, methods and instruments known to those skilled in the art may not be discussed in detail, but where appropriate, the techniques, methods and instruments should be considered as part of the specification.

In all of the examples illustrated and discussed herein, any specific values should be construed as merely illustrative, and not as a limitation. Thus, other examples of the exemplary embodiments may have different values.

It should be noted that similar reference numerals and letters refer to similar items in the following figures, and therefore, once an item is defined in a figure, it is not required to be further discussed in the subsequent figures.

Figure 2:
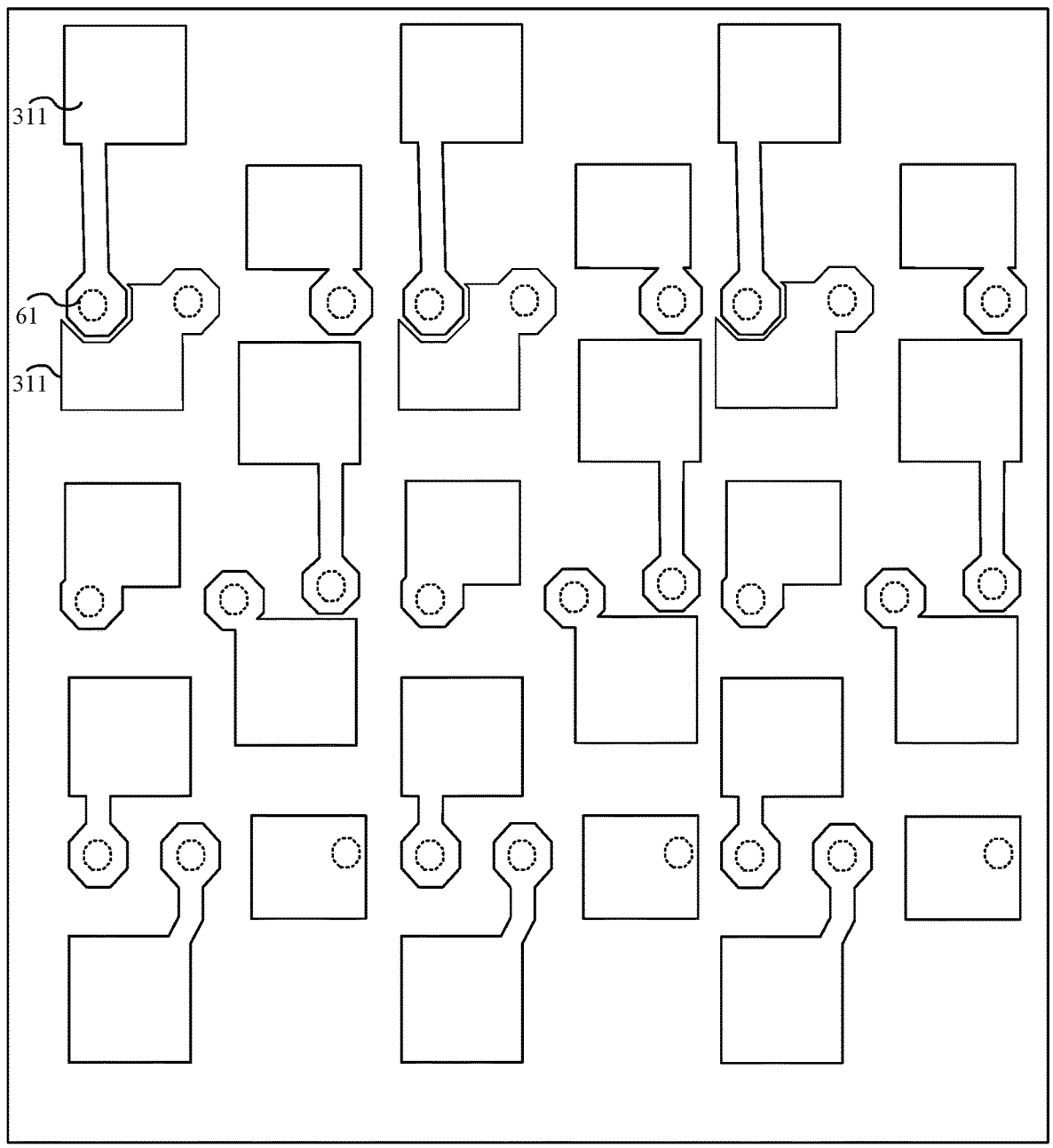
FIG. 2 illustrates a structural schematic of a display panel.

FIG. 1 illustrates a schematic of a drive circuit compression. FIG. 2 illustrates a structural schematic of a display panel. Referring to FIG. 1 and FIG. 2, in order to reserve the designing space for imaging apertures 62, drive circuits 20 may need to be compressed. However, based on the display panel requirements, the positions and periodicities of light-emitting regions of pixels may not be changed, that is, anode positions of organic light-emitting units disposed at opening regions of a pixel defining layer may not be changed. Therefore, after compressing the drive circuits 20, the drive circuit 20 corresponding to a current anode 311 may be within the coverage of other anodes 311; when the current anode 311 is electrically connected to the corresponding drive circuit 20 through a via 61, a vertical projection of the via 61 on the plane of the current anode 311 may be on the other anodes 311. In order to avoid the via 61, the light-emitting areas of the other anodes 311 may be reduced greatly, which may cause the uneven display of the display panel.

Based on above-mentioned technical problem, embodiments of the present disclosure may provide a display panel.

The display panel may include a substrate, a plurality of drive circuits and a plurality of organic light-emitting units, which are stacked sequentially. The drive circuits and the organic light-emitting units may be electrically connected in a one-to-one correspondence, and the anodes of the organic light-emitting units may be electrically connected to the drive circuits through the vias.

The plurality of drive circuits may be divided into a plurality of drive circuit groups. Each drive circuit group may include multiple drive circuits arranged in an array. The anodes of the plurality of organic light-emitting units may be evenly arranged.

The display panel may further include a light-blocking layer and a plurality of fingerprint recognition units. A plurality of imaging apertures may be formed at the light-blocking layer. Vertical projections of the imaging apertures on a film layer having the drive circuits may be between two adjacent drive circuit groups. The fingerprint recognition units may be on a side of the light-blocking layer away from the organic light-emitting units. Light reflected by a touch body may enter the fingerprint recognition units through the imaging apertures. A distance between two adjacent drive circuits in the drive circuit group may be less than a distance between two adjacent drive circuits in two adjacent drive circuit groups along a first direction. The drive circuit group may include M rows of the drive circuits along the first direction, where the drive circuits from a first row to an i-th row may be a first drive circuit, the drive circuits from a j-th row to an M-th row may be a second drive circuit, and $1 \leq i < j \leq M$. A first direction component, along the first direction, of each of vias that correspond to at least a portion of the first drive circuit pointing to a corresponding electrically-connected anode, and a second direction component, along the first direction, of each of vias that correspond to at least a portion of the second drive circuit pointing to a corresponding electrically-connected anode, are opposite components. The first direction may be a row direction or a column direction of the drive circuits arranged in the array. According to the above-mentioned technical solution, the drive circuits may be divided into the plurality of drive circuit groups; the distance between the two adjacent drive circuits in the drive circuit group may be configured to be less than the distance between the two adjacent drive circuits in the two adjacent drive circuit groups along the first direction; and the imaging aperture may be disposed between two adjacent drive circuits. Furthermore, a first direction component, along the first direction, of each of vias that correspond to the first drive circuit at an initial position in one drive circuit group pointing to a corresponding electrically-connected anode, and a second direction component, along the first direction, of each of vias that correspond to the second drive circuit at an ending position in the one drive circuit group pointing to a corresponding electrically-connected anode, are opposite components. In such way, when the first drive circuit at the initial position in the drive circuit group is electrically connected to the anodes of the corresponding organic light-emitting units and the second drive circuit at the ending position in the drive circuit group is electrically connected to the anodes of the corresponding organic light-emitting units, it may ensure that the area reduction of the opening regions caused by the vias may be evenly distributed in the organic light-emitting units corresponding to the entire drive circuit group, thereby ensuring the desirable display effect.

In order to further illustrate the above-mentioned described technical solution of the present disclosure, various specific embodiments of the present disclosure will be described in detail below with reference to the accompanying drawings. Based on the embodiments of the present disclosure, all other embodiments obtained by those skilled in the art without departing from the scope of the disclosure are within the scope of the embodiments of the present disclosure.

Figure 3:
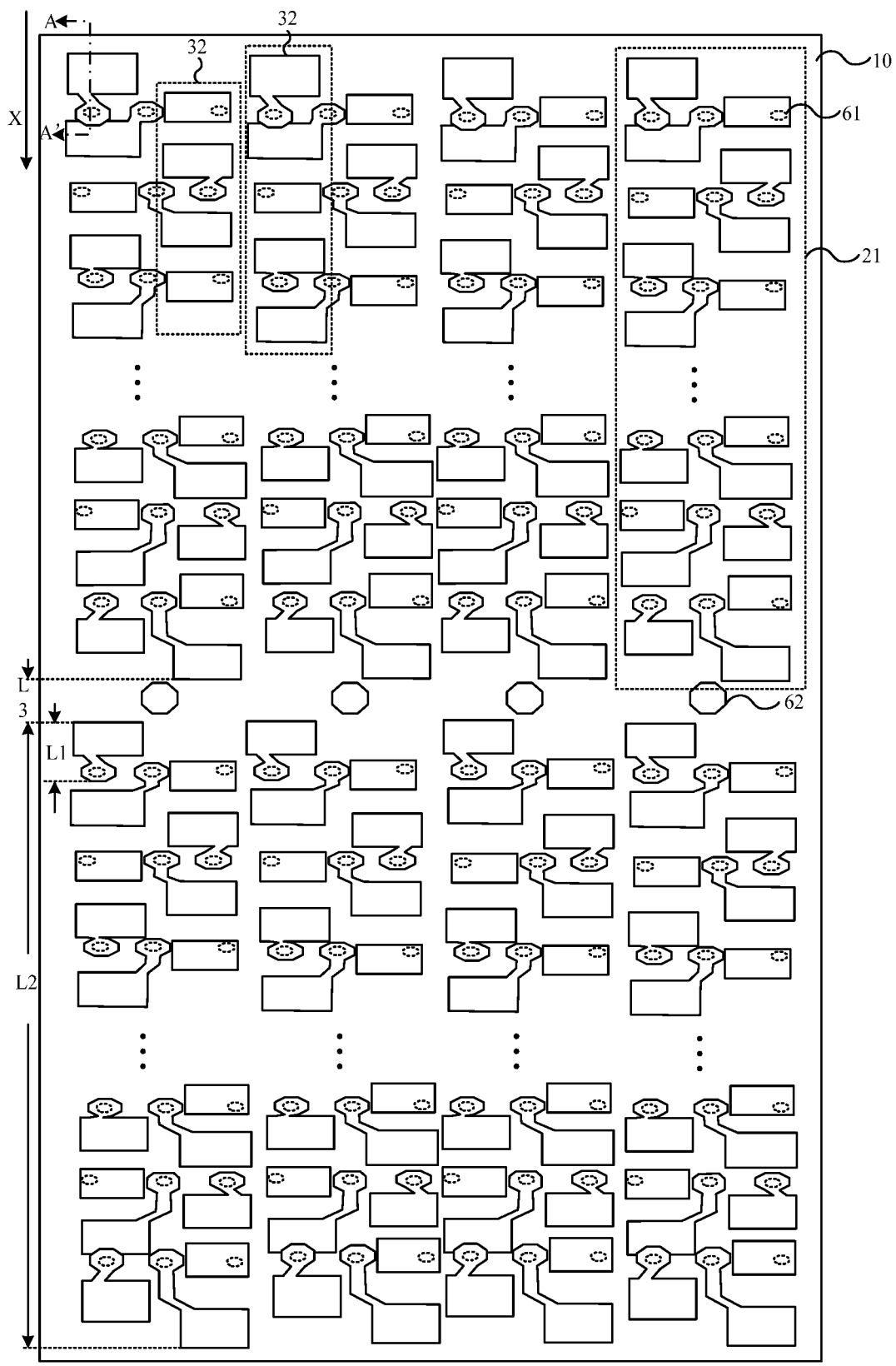
FIG. 3 illustrates a top-view schematic of an exemplary display panel according to embodiments of the present disclosure.
Figure 4:
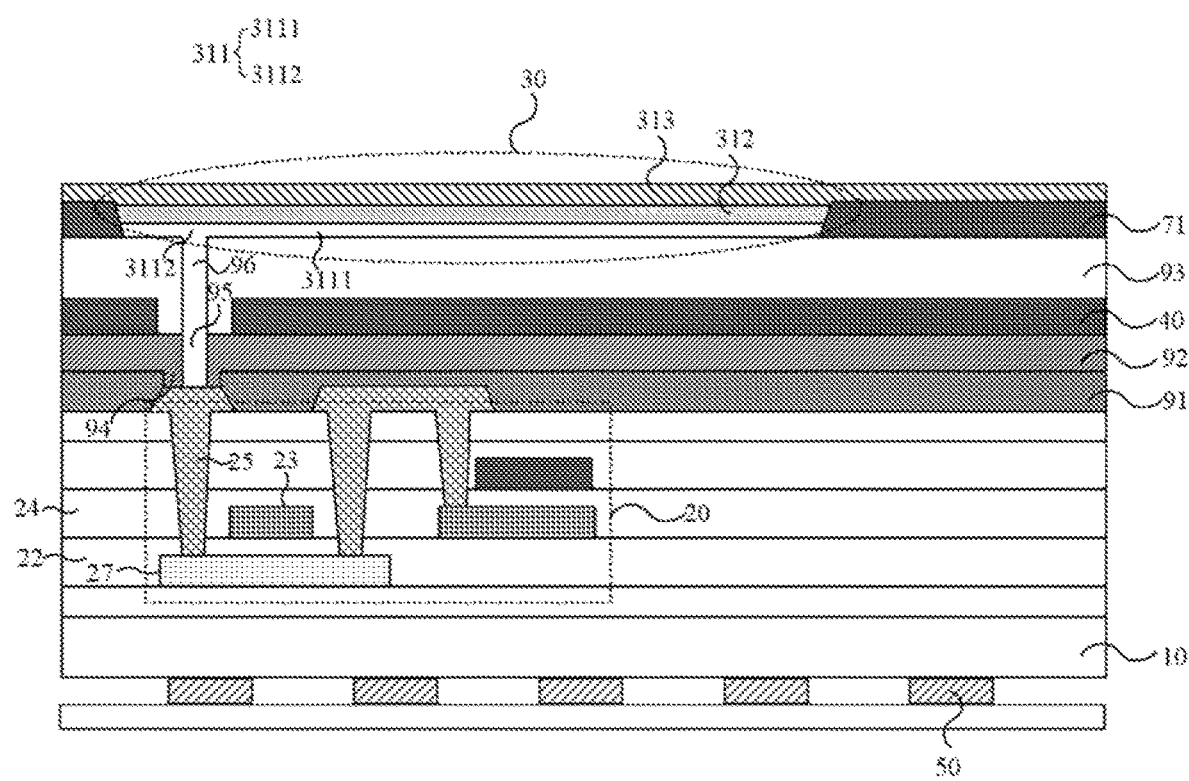
FIG. 4 illustrates a cross-sectional structural schematic of the exemplary display panel along a A-A' direction in FIG. 3.
Figure 5:
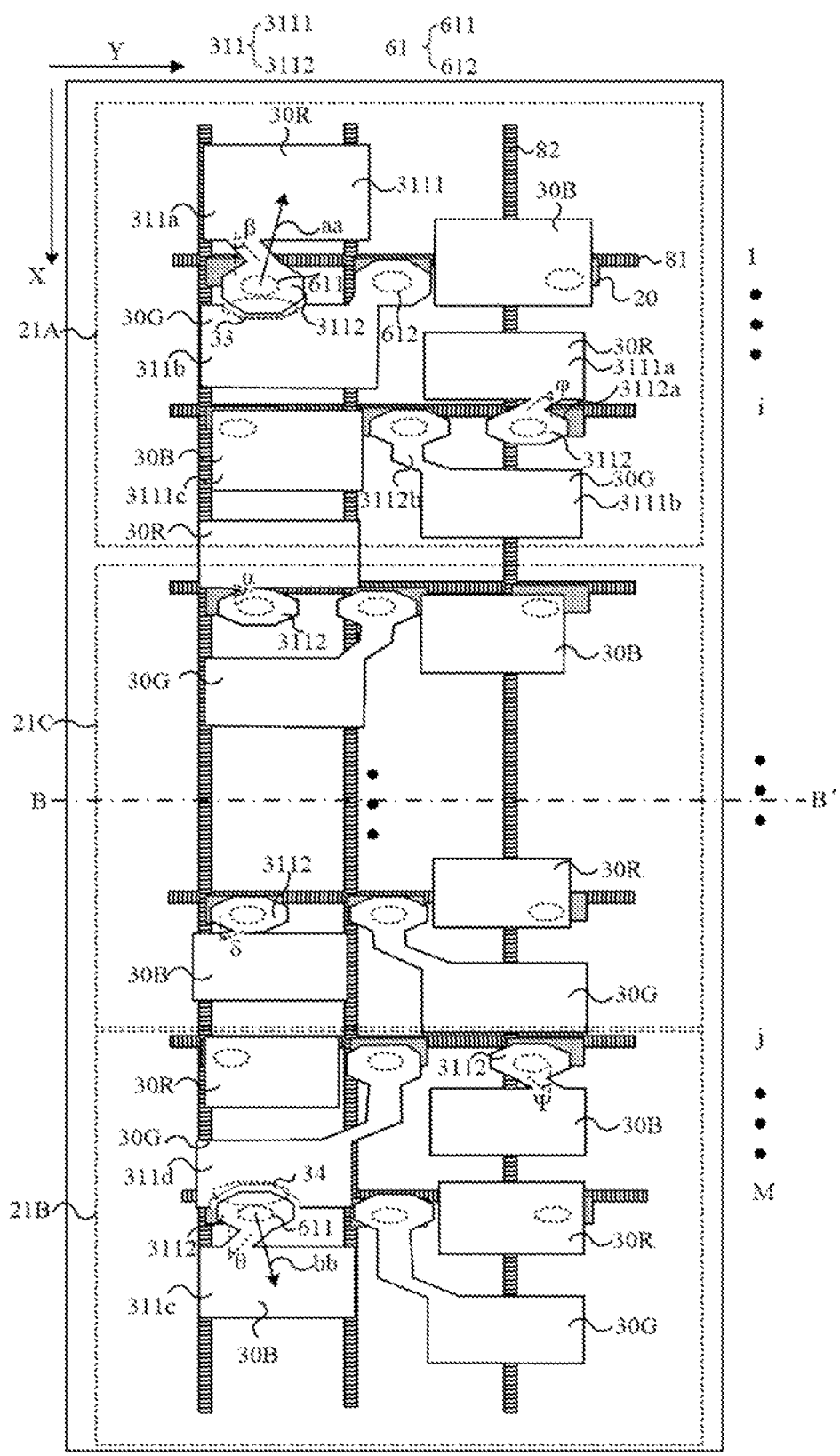
FIG. 5 illustrates a top-view schematic of an exemplary display panel including only one drive circuit group according to embodiments of the present disclosure.

FIG. 3 illustrates a top-view schematic of an exemplary display panel according to embodiments of the present disclosure. FIG. 4 illustrates a cross-sectional structural schematic of the exemplary display panel along a A-A' direction in FIG. 3. FIG. 5 illustrates a top-view schematic of an exemplary display panel including only one drive circuit group according to embodiments of the present disclosure. As shown in FIG. 3, FIG. 4 and FIG. 5, the display panel provided by the embodiments of the present disclosure may include a substrate 10, a plurality of drive circuits 20, and a plurality of organic light-emitting units 30, which are stacked sequentially. The drive circuits 20 and the organic light-emitting units 30 may be electrically connected in a one-to-one correspondence, and the anodes 311 of the organic light-emitting units 30 may be electrically connected to the drive circuits 20 through vias 61. The plurality of drive circuits 20 may be divided into a plurality of drive circuit groups 21. Each drive circuit group 21 may include multiple drive circuits 20 arranged in the array. The anodes 311 of the plurality of organic light-emitting units 30 may be evenly arranged. The display panel may further include a light-blocking layer 40 and a plurality of fingerprint recognition units 50. A plurality of imaging apertures 62 may be formed at the light-blocking layer 40. The vertical projections of the imaging apertures 62 on the film layer having the drive circuits 20 may be between two adjacent drive circuit groups 21. The fingerprint recognition units 50 may be on a side of the light-blocking layer 40 away from the organic light-emitting units 30. Light reflected by the touch body may enter the fingerprint recognition units 50 through the imaging apertures 62.

A distance between two adjacent drive circuits 20 in the drive circuit group 21 is less than a distance between two adjacent drive circuits 20 in two adjacent drive circuit groups 21 along the first direction; the drive circuit group 21 includes M rows of the drive circuits along the first direction, where the drive circuits from the first row to the i-th row is the first drive circuit, the drive circuits from the j-th row to the M-th row is the second drive circuit, and $1 \leq i < j \leq M$; A first direction component, along the first direction, of each of vias 61 that correspond to at least a portion of the first drive circuit 21A pointing to a corresponding electrically-connected anode 311, and a second direction component, along the first direction, of each of vias 61 that correspond to at least a portion of the second drive circuit 21B pointing to a corresponding electrically-connected anode 311, are opposite components. The first direction may be the row direction or the column direction of the drive circuits 20 arranged in the array. Optionally, the first direction may be understood as the column direction in FIG. 5 in one embodiment.

Optionally, the substrate 10 may be a rigid substrate or a flexible substrate. The material of the substrate 10 may not be limited according to various embodiments of the present disclosure. The drive circuits 20 may include an active layer 27, a gate insulation layer 22, a gate electrode layer 23, an interlayer insulation layer 24, and a source/drain electrode layer 25 sequentially. The gate electrode layer 23 may form a gate, a scan line, and a first electrode of a storage capacitor in the drive circuit 20. The source/drain electrode layer 25 may form a source, a drain, a data line, and a power signal line in the drive circuit 20. The gate insulation layer 22 and the interlayer insulation layer 24 may be made of a material including an oxide of silicon or a nitride of silicon, which may not be limited according to various embodiments of the present disclosure. The drive circuits 20 may further include an intermediate insulation layer and an intermediate metal layer, which may be stacked along a direction away from the substrate 10 and may be between the gate electrode layer 23 and the interlayer insulation layer 24. The intermediate metal layer may be used to form a second electrode of the storage capacitor and a reference voltage line. The organic light-emitting units 30 may include the anodes 311, the pixel defining layer 71, an organic light-emitting layer 312, and a cathode layer 313. The pixel defining layer 71 may include pixel defining layer openings which may be in a one-to-one correspondence with the anodes 311 and expose the anode bodies. The display panel may further include an encapsulation layer (not shown) on a side of the organic light-emitting units 30 away from the substrate 10, which may be used for water and oxygen protection of the organic light-emitting units 30.

As shown in FIG. 3, the distance between the two adjacent drive circuits 20 in the drive circuit group 21 may be less than the distance between the two adjacent drive circuits 20 in the two adjacent drive circuit groups 21 along the first direction (the X direction shown in FIG. 3). In the drive circuit group 21, a gap between the two adjacent drive circuits 20 may be compressed to reduce a corresponding coverage area and thus to reduce the coverage areas of the entire drive circuit group 21 and reserve the designing space for the imaging apertures 62, which may ensure the display panel to implement the fingerprint recognition function.

Furthermore, as shown in FIG. 5, in order to solve the uneven display technical problem that the vias 61 may occupy the regions for disposing the anodes of other organic light-emitting units in the process of compressing the entire drive circuit group 21, which may be caused by the compression of the drive circuits 20, a first direction component aa, along the first direction, of each of vias 61 that correspond to at least a portion of the first drive circuit 21A in the drive circuit group 21 pointing to a corresponding electrically-connected anode 311, and a second direction component bb, along the first direction, of each of vias 61 that correspond to at least a portion of the second drive circuit 21B in the drive circuit group 21 pointing to a corresponding electrically-connected anode 311, are opposite components in the embodiments of the present disclosure. The first drive circuit 21A may include the drive circuits 20 from the first row to the i-th row, that is, the drive circuits 20 at the initial position in the drive circuit group 21 in the order from 1 to M. The second drive circuit 21B may include the drive circuits 20 from the j-th row to the M-th row, that is, the drive circuits 20 at an ending position in the drive circuit group 21 in the order from 1 to M. The first direction may be the row direction or the column direction of the drive circuits 20 arranged in the array. In such way, when compressing the drive circuit group 21, the drive circuits 20 at the initial position may be compressed toward the drive circuits 20 at the ending position and the drive circuits 20 at the ending position may be compressed toward the drive circuits 20 at the initial position, that is, the entire drive circuit group 21 may be compressed approximately toward a center position of the drive circuit group 21. Therefore, misalignment degree between the drive circuits 20 at the initial position and the ending position of the drive circuit group 21 and the corresponding anodes 311 of the organic light-emitting units 30 may be ensured to be small; and distances between the drive circuits 20 at the initial position and the ending position of the drive circuit group 21 and the corresponding anodes 311 of the organic light-emitting units 30 may be ensured to be not too large. When the entire drive circuit group 21 is compressed in a same direction (e.g., a direction at the initial position or a direction at the ending position), the electrically connected vias 61 may be avoided to be completely located in the coverage regions of the anodes 311 of the other organic light-emitting units 30 due to the large misalignment degree between the drive circuits 20 at the initial position and the ending position of the drive circuit group 21 and the corresponding anodes 311 of the organic light-emitting units 30, which may affect the light-emitting areas of the other anodes 311, resulting in uneven display of the entire display panel. In addition, connecting portions may be avoided to be too long when the anodes 311 in the openings of the pixel defining layer are connected to the corresponding drive circuits 20 due to the large distances between the drive circuits 20 at the initial position and the ending position of the drive circuit group 21 and the corresponding anodes 311 of the organic light-emitting units 30. When passing through the anodes 311 of the other organic light-emitting units 30, the connecting portions may affect the light-emitting areas of the other anodes 311, resulting in uneven display of the entire display panel. Therefore, in the technical solution provided in the embodiments of the present disclosure, the first direction component aa, along the first direction, of each of vias 61 that correspond to at least a portion of the first drive circuit 21A in each drive circuit group 21 pointing to a corresponding electrically-connected anode 311, and the second direction component bb, along the first direction, of each of vias 61 that correspond to at least a portion of the second drive circuit 21B in the each drive circuit group 21 pointing to a corresponding electrically-connected anode 311, are opposite components. In such way, the misalignment degree between the drive circuits 20 at the initial position and the ending position of the drive circuit group 21 and the corresponding anodes 311 of the organic light-emitting units 30 may be ensured to be small, and the vias 61 may be partially or not be located in the coverage regions of the other anodes 311 when the drive circuits 20 are electrically connected to the anodes 311 of the corresponding organic light-emitting units 30; or the connecting portions may be short when the anodes 311 in the openings of the pixel defining layer are connected to the corresponding drive circuits 20, and the connecting portions may be partially or not be located in the coverage regions of the other anodes 311, thereby ensuring the influence reduction of the drive circuit compression. In addition, compressing the entire drive circuit group 21 approximately toward the center position of the drive circuit group 21 may ensure that the opening area reduction at the initial position and the ending position caused by the compression of the drive circuits 20 may be evenly distributed in the organic light-emitting units corresponding to the entire drive circuit group 21, thereby ensuring the desirable display effect.

It should be understood that the initial position of the drive circuit group 21 may include one or more rows of the drive circuits 20, and the ending position of the drive circuit group 21 may include one or more rows of the drive circuits 20.

Optionally, the first direction component, along the first direction, of each of vias 61 that correspond to at least a portion of the first drive circuit 21A pointing to a corresponding electrically-connected anode 311, and the second direction component, along the first direction, of each of vias 61 that correspond to at least a portion of the second drive circuit 21B pointing to a corresponding electrically-connected anode 311, are opposite components. It can be understood that, an extending direction of the projection along the first direction of the direction pointing from the vias 61 corresponding to at least the portion of the first drive circuit 21A to the anodes 311 electrically connected to the vias 61, may be opposite to an extending direction of the projection along the first direction of the direction pointing from the vias 61 corresponding to at least the portion of the second drive circuit 21B to the anodes 311 electrically connected to the vias 61.

Optionally, referring to FIG. 5, the display panel may include a plurality of scan lines 81 and a plurality of data lines 82. The scan lines 81 may extend along the second direction (the Y direction in FIG. 5) and may be arranged along the first direction (the X direction in FIG. 5). The data lines 82 may extend along the first direction and may be arranged along the second direction. The second direction may intersect the first direction. The plurality of scan lines 81 and the plurality of data lines 82 may insulatively cross to substantially define a plurality of pixel units. Each pixel unit may include one drive circuit 20. The uniform arrangement of the drive circuits 20 in one drive circuit group 21 may be understood as the drive circuits 20 in one drive circuit group 21 may be arranged in a matrix along the first direction and the second direction.

Optionally, the distances between the two adjacent drive circuits 20 in the first drive circuit 21A may be equal, and the distances between the two adjacent drive circuits 20 in the second drive circuit 21B may be equal.

Optionally, the distance between the first drive circuit 21A and the second drive circuit 21B may be less than the distance between the two adjacent drive circuits 20 in the first drive circuit 21A. The distance between the first drive circuit 21A and the second drive circuit 21B may be less than the distance between the two adjacent drive circuits 20 in the second drive circuit 21B. Optionally, the distance between the first drive circuit 21A and the second drive circuit 21B may be larger than the distance between the two adjacent drive circuits 20 in the first drive circuit 21A. The distance between the first drive circuit 21A and the second drive circuit 21B may be larger than the distance between the two adjacent drive circuits 20 in the second drive circuit 21B.

Optionally, the distance between the two adjacent drive circuits 20 in each drive circuit group 21 may be less than the distance between the two adjacent drive circuits 20 in the two adjacent drive circuit groups 21. Therefore, the compression efficiency of the drive circuits 20 and the arrangement uniformity of the drive circuits 20 in the drive circuit group 21 may be improved, which may avoid the coupling difference of the drive circuits due to the inconsistent spacing of the drive circuits 20 and may affect the display function.

Referring to FIG. 4 and FIG. 5, at least a portion of the anodes 311 may include electrode portions 3111 in the opening regions of the pixel defining layer 71 and connecting portions 3112 connected to the electrode portions 3111. The vertical projections of the connecting portions 3112 on the substrate 10 may cover the vertical projections of the vias 61 on the substrate 10. The connecting portions 3112 may be electrically connected to the drive circuits 20 through the vias 61. The drive circuit group 21 may further include a third drive circuit 21C between the first drive circuit 21A and the second drive circuit 21B along the first direction. The tilt degree of the connecting portions 3112 corresponding to the third drive circuit 21C with respect to the first direction may be greater than the tilt degree of the connecting portions 3112 corresponding to the first drive circuit 21A with respect to the first direction. The tilt degree of the connecting portions 3112 corresponding to the third drive circuit 21C with respect to the first direction may be greater than the tilt degree of the connecting portions 3112 corresponding to the second drive circuit 21B with respect to the first direction.

As shown in FIG. 5, the tilt degree of the connecting portion 3112 with respect to the first direction (the X direction in FIG. 5) may be understood as an acute angle between the extending direction of the connecting portion 3112 and the first direction. When the acute angle between the extending direction of the connecting portion 3112 and the first direction is larger, it may indicate that the tilt degree of the connecting portion 3112 with respect to the first direction is larger, and also indicate that the misalignment between the drive circuit 20 and the anode 311 of the corresponding organic light-emitting unit 30 is smaller. For example, when the acute angle between the extending direction of the connecting portion 3112 and the first direction is close to 90°, it may indicate that the via 61 may be in the coverage of the electrode portion 3111 and the drive circuit 20 may not be misaligned with the anode 311 of the organic light-emitting unit 30. As shown in FIG. 5, an acute angle α between the connecting portion 3112 corresponding to the third drive circuit 21C with respect to the first direction may be greater than an acute angle between the connecting portion 3112 corresponding to the first drive circuit 21A with respect to the first direction. That is, the tilt degree of the connecting portion 3112 corresponding to the third drive circuit 21C with respect to the first direction may be greater than the tilt degree of the connecting portion 3112 corresponding to the first drive circuit 21A with respect to the first direction. Similarly, an acute angle δ between the connecting portion corresponding to the third drive circuit 21C with respect to the first direction may be greater than an acute angle θ between the connecting portion 3112 corresponding to the second drive circuit 21B with respect to the first direction. That is, the tilt degree of the connecting portion 3112 corresponding to the third drive circuit 21C with respect to the first direction may be greater than the tilt degree of the connecting portion 3112 corresponding to the second drive circuit 21B with respect to the first direction. The entire circuit group 21 may be ensured to be compressed toward approximately the center of the drive circuit group 21, which may result in small misalignments between the portion of the drive circuits 20 of the third drive circuit 21C and the anodes 31 of the corresponding organic light-emitting units 30. During the transition from the first drive circuit 21A to the third drive circuit 21C, it may ensure that the area reduction of the opening regions in the drive circuit group 21 caused by the compression of the drive circuits 20 may be evenly distributed in the organic light-emitting units corresponding to the first drive circuit 21A and the third drive circuit 21C, thereby ensuring the desirable display effect. Similarly, during the transition from the second drive circuit 21B to the third drive circuit 21C, it may ensure that the area reduction of the opening regions in the drive circuit group 21 caused by the compression of the drive circuits 20 may be evenly distributed in the organic light-emitting units corresponding to the second drive circuit 21B and the third drive circuit 21C, thereby ensuring the desirable display effect. By setting the third drive circuit 21C between the first drive circuit 21A and the second drive circuit 21B, the third drive circuit 21C may be configured as the transition drive circuit between the first drive circuit 21A and the second drive circuit 21B, which may avoid a notable structure difference between the first drive circuit 21A and the second drive circuit 21B, and may further cause a display difference and a notable boundary between the first drive circuit 21A and the second drive circuit 21B.

Optionally, referring to FIG. 5, the misalignment degree between the drive circuits from the first row to the i-th row in the first drive circuit 21A and the anodes electrically connected to the drive circuits from the first row to the i-th row in the first drive circuit 21A may be gradually reduced along the first direction; and the misalignment degree between the drive circuits from the j-th row to the M-th row in the first drive circuit 21A and the anodes electrically connected to the drive circuits from the j-th row to the M-th row in the first drive circuit 21A may be gradually increased along the first direction.

The tilt degree of the connecting portion 3112 with respect to the first direction (the X direction in FIG. 5) may be understood as an acute angle between the extending direction of the connecting portion 3112 and the first direction. As shown in FIG. 5, an acute angle φ between the connecting portions 3112 corresponding to the i-th row drive circuits 20 with respect to the first direction may be greater than an acute angle β between the connecting portions 3112 corresponding to the 1st row drive circuit with respect to the first direction. That is, the misalignment degree between the drive circuits from the 1st row to the i-th row in the first drive circuit 21A and the anodes electrically connected to the drive circuits from the 1st row to the i-th row in the first drive circuit 21A may be gradually reduced. Similarly, an acute angle between the connecting portions 3112 corresponding to the j-th row drive circuits 20 with respect to the first direction may be greater than an acute angle θ between the connecting portions 3112 corresponding to the M-th row drive circuit with respect to the first direction. That is, the misalignment degree between the drive circuits from the j-th row to the M-th row in the second drive circuit 21B and the anodes electrically connected to the drive circuits from the j-th row to the M-th row in the first drive circuit 21A may be gradually increased. Both the first drive circuit group 21A and the second drive circuit group 21B may be ensured to be compressed approximately toward the center of the drive circuit group 21. The misalignment degree between the drive circuits 20 at the initial position and at the ending position of the drive circuit group 21 and the corresponding anodes 311 of the organic light-emitting units 30 may be ensured to be small, and the vias may be partially or not be located in the coverage regions of the other anodes 311 when the drive circuits 20 are electrically connected to the anodes 311 of the corresponding organic light-emitting units 30; or the connecting portions may be short when the anodes 311 in the openings of the pixel defining layer are connected to the corresponding drive circuits 20, and the connecting portions may be partially or not be located in the coverage regions of the other anodes 311, thereby ensuring the influence reduction of the drive circuit compression. In addition, it may ensure that the area reduction of the opening regions at the initial position and the ending position caused by the compression of the drive circuits 20 may be evenly distributed in the organic light-emitting units corresponding to the entire drive circuit group 21, thereby ensuring the desirable display effect.

Optionally, referring to FIG. 5, in the drive circuit group 21, the connecting portions 3112 corresponding to at least the portion of the first drive circuit 21A and the connecting portions 3112 corresponding to at least the portion of the second drive circuit 21B may be symmetrical along a first center-line B-B' of the drive circuit group 21 where the first center-line B-B' is perpendicular to the first direction.

By setting that the connecting portions 3112 corresponding to at least the portion of the first drive circuit 21A and the connecting portions 3112 corresponding to at least the portion of the second drive circuit 21B may be symmetrical along the first center-line B-B' of the drive circuit group 21, it may ensure that the relative positional relationship between the drive circuits 20 and the anodes 311 of the corresponding organic light-emitting units 30 in the first drive circuit 21A and the second drive circuit 21B may be completely symmetrical; it may ensure that the opening region areas caused by the compression of the drive circuits 20 in the first drive circuit 21A and the second drive circuit 21B may be same; it may also ensure that the opening region areas caused by the compression of the drive circuits 20 may be symmetrical with each other, and the display effect at the initial position and the ending position may be symmetrical when displaying by the organic light-emitting units 30 corresponding to the drive circuit group 21, thereby ensuring the desirable display effect.

Optionally, referring to FIG. 4 and FIG. 5, the vias 61 may include first vias 611. The anodes 311 arranged along the first direction and regions between two adjacent anodes 311 along the first direction may constitute anode coverage regions 32. The vertical projections of the first vias 611 on the substrate 10 may be within the vertical projections of the anode coverage regions 32 on the substrate 10. A first direction component, along the first direction, of each of the first vias 611 that correspond to at least a portion of the first drive circuit 21A pointing to a corresponding electrically-connected anode 311, and a second direction component, along the first direction, of each of the first vias 611 that correspond to at least a portion of the second drive circuit 21B pointing to a corresponding electrically-connected anode, are opposite components.

In one embodiment, the organic light-emitting units 30 may be aligned and arranged along the column direction (e.g., the first direction). The anodes of one column of the organic light-emitting units 30 may be defined as one anode coverage region 32, and a spacing may be between adjacent anode coverage regions 32. The vias 61 may include the first vias 611 and second vias 612. The first vias 611 may refer to the vias 61 that the vertical projections of the vias 61 on the substrate 10 may be within the vertical projections of the anode coverage regions 32 on the substrate 10. The second vias 612 may refer to the vias 61 that the vertical projections of the vias 61 on the substrate 10 may be outside the vertical projections of the anode coverage regions 32 on the substrate 10, that is, the vertical projections of the second vias 612 on the substrate 10 may fall into the spacing between the adjacent anode coverage regions 32. The drive circuits 20 electrically connected to the anodes 311 of the corresponding organic light-emitting units 30 through the first vias 611 may be completely located in the coverage regions of the anodes 31 of the other organic light-emitting units when compressing the drive circuits 20, which may affect the light-emitting areas of the other anodes 31. By setting that the first direction component, along the first direction, of each of the first vias 611 that correspond to at least a portion of the first drive circuit 21A pointing to a corresponding electrically-connected anode 311, and the second direction component, along the first direction, of each of the first vias 611 that correspond to at least a portion of the second drive circuit 21B pointing to a corresponding electrically-connected anode, are opposite components, the drive circuits 20 may not be compressed extensively toward the first direction or the opposite direction of the first direction when compressing the drive circuits 20 along the first direction and may not have the extreme situation that the drive circuits 20 may be completely located in the coverage regions of the anodes 311 of the other organic light-emitting units 30, and the connecting portions 3112 may not be too long, thereby ensuring relatively small impact on the other organic light-emitting units 30 and the desirable display effect.

Optionally, referring to FIG. 5, the first drive circuit 21A may at least include first anodes 311a and second anodes 311b along the first direction. The first anodes 311a may be on a side of the second anodes 311b away from the second drive circuit 21B. First notch regions 33 may be on the side of the second anodes 311b adjacent to the first anodes 311a. The vertical projections of the first vias 611 corresponding to the first anodes 311a on the substrate 10 may overlap the vertical projections of the first notch regions 33 on the substrate 10. The second drive circuit 21B may at least include third anodes 311c and fourth anodes 311d along the first direction. The third anodes 311c may be on a side of the fourth anodes 311d away from the first drive circuit 21A. Second notch regions 34 may be on the side of the fourth anodes 311d adjacent to the third anodes 311c. The vertical projections of the first vias 611 corresponding to the third anodes 311c on the substrate 10 may overlap the vertical projections of the second notch regions 34 on the substrate 10.

As shown in FIG. 5, the vertical projections of the first vias 611 corresponding to the first anodes 311a on the substrate 10 may be set to overlap the vertical projections of the first notch regions 33 on the substrate 10; and the vertical projections of the first vias 611 corresponding to the third anodes 311c on the substrate 10 may be set to overlap the vertical projections of the second notch regions 34 on the substrate 10, which may ensure that the drive circuits 20 corresponding to the first anodes 311a may be only partially within the coverage range of the second anodes 311b and have less impact on the second anodes 311b; similarly, it may ensure that the drive circuits 20 corresponding to the third anodes 311c may be only partially within the coverage range of the fourth anodes 311d and have less impact on the fourth anodes 311d, thereby ensuring the desirable display effect of the display panel. Meanwhile, as shown in FIG. 5, the first notch regions 33 may be on the side of the second anodes 311b adjacent to the first anodes 311a, that is, the first notch regions 33 may be on the upper side of the second anodes 311b; and the second notch regions 34 may be on the side of the fourth anodes 311d adjacent to the third anodes 311c, that is, the second notch regions 34 may be on the lower side of the fourth anodes 311d. The notch regions on the upper side of the anodes and the notch regions on the lower side of the anodes may be in the same drive circuit group 21. The relative positional relationship between the notch regions and the anodes may be arranged evenly to avoid display problems due to that the notch regions may be disposed on the same side of the anodes.

Figure 6:
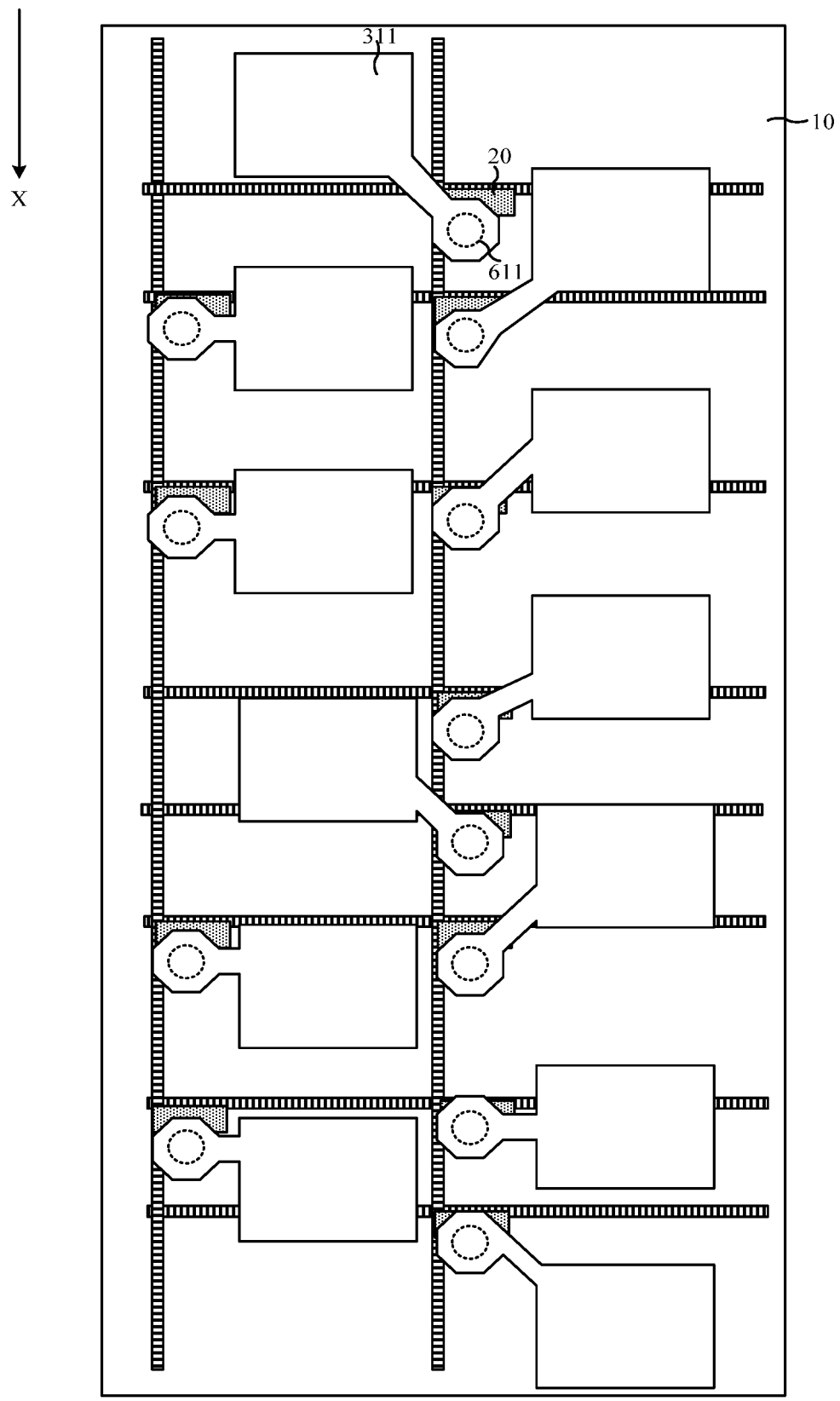
FIG. 6 illustrates a top-view schematic of another exemplary display panel according to embodiments of the present disclosure.

FIG. 6 illustrates a top-view schematic of another exemplary display panel according to embodiments of the present disclosure. The vertical projections of the drive circuits 20 on the substrate 10 may be between the vertical projections of two adjacent rows of the anodes 311 on the substrate 10 along a direction perpendicular to the first direction.

The vertical projections of the drive circuits 20 on the substrate 10 may be set to be between the vertical projections of two adjacent rows of the anodes 311 on the substrate 10, which may ensure that the vertical projections of the drive circuits 20 on the substrate 10 may not overlap the vertical projections of the anodes 311 on the substrate 10 when compressing the drive circuits 20 along the first direction, and may also ensure that setting the vias 61 occupying the space of the anodes 311 may not affect the light-emitting region of the organic light-emitting units 30, thereby ensuring the desirable display effect of the display panel.

Optionally, the imaging apertures 62 may also in the gaps between the anode coverage regions (not shown). In such way, the imaging apertures 62 may be prevented from being too close to the organic light-emitting units 30, and light emitted from the organic light-emitting units 30 may be prevented from affecting the recognition of the reflected light of fingerprints. Furthermore, the vertical projections of the drive circuits 20 on the substrate 10 may be between the vertical projections of two adjacent rows of the anodes 311 on the substrate 10, so the vertical projections of the vias 61 on the substrate 10 may be also between the vertical projections of the two adjacent rows of the anodes 311 on the substrate 10. The anode connecting portions may be required for connecting anodes, but the anode connecting portion may not emit light. Therefore, the imaging apertures 62 may be multiplexed with the vias 61.

Optionally, referring to FIG. 5, the organic light-emitting units 30 may include red organic light-emitting units 30R, green organic light-emitting units 30G, and blue organic light-emitting units 30B. The red organic light-emitting units 30R, the green organic light-emitting units 30G, and the blue organic light-emitting units 30B may be arranged sequentially and repeatedly along the first direction. Along the second direction, the red organic light-emitting units 30R may be adjacent to one another; the green organic light-emitting units 30G may be adjacent to one another; and the blue organic light-emitting units 30B may be adjacent to one another. Any adjacent light-emitting units selected from the red organic light-emitting units 30R, the green organic light-emitting units 30G, and the blue organic light-emitting units 30B may be arranged in a triangle shape. The first direction may intersect the second direction. The vias 61 may include the first vias 611 and the second vias 612. The anodes 311 arranged along the first direction and the regions between the two adjacent anodes 311 may constitute the anode coverage regions 32. The vertical projections of the first vias 611 on the substrate 10 may be within the vertical projections of the anode coverage regions 32 on the substrate 10. The vertical projections of the second vias 612 on the substrate 10 may be outside of the vertical projections of the anode coverage regions 32 on the substrate 10. The anodes 311 of the red organic light-emitting units 30R may be electrically connected to the drive circuits 20 through the first vias 611. The anodes 311 of the green organic light-emitting units 30G may be electrically connected to the drive circuits 20 through the second vias 612. The anodes 311 of the blue organic light-emitting units 30B may be electrically connected to the drive circuits 20 through the first vias 611.

As shown in FIG. 5, the display panel provided by the embodiments of the present disclosure may further include the plurality of scan lines 81 extending along the first direction and the plurality of data lines 82 extending along the second direction. The drive circuits 20 corresponding to at least one group of the red organic light-emitting units 30R, the green organic light-emitting units 30G and the blue organic light-emitting units 30B, which are arranged in the triangle shape, may be sequentially arranged along the direction of the scan lines 81, and may be connected to a same scan line 81 and connected to the different data lines 82 respectively.

As shown in FIG. 5, the display panel may include the plurality of scan lines 81 and the plurality of data lines 82. The scan lines 81 may extend along the second direction (the Y direction shown in FIG. 5) and may be arranged along the first direction (the X direction shown in FIG. 5). The data lines 82 may extend along the first direction and be arranged along the second direction, where the second direction may intersect the first direction. The plurality of scan lines 81 and the plurality of data lines 82 may insulatively cross to substantially define the plurality of pixel units. The drive circuits 20 may be arranged in an array along the direction of the scan lines 81 and the direction of the data lines. The drive circuits 20 in the same row may be electrically connected to one corresponding scan line 81. Similarly, the drive circuits 20 in the same column may be electrically connected to one corresponding data line 82.

Furthermore, the anodes 311 of the red organic light-emitting units 30R may include first electrode portions 3111a in the opening regions of the pixel defining layer and first connecting portions 3112a connected to the first electrode portions 3111a. The vertical projections of the first connecting portions 3112a on the substrate 10 may overlap the vertical projections of the first vias 611 on the substrate 10. The anodes 311 of the green organic light-emitting units 30G may include second electrode portions 3111b in the opening regions of the pixel defining layer and second connecting portions 3112b connected to the second electrode portions 3111b. The vertical projections of the second connecting portions 3112b on the substrate 10 may overlap the vertical projections of the second vias 612 on the substrate 10. The anodes 311 of the blue organic light-emitting units 30B may include third electrode portions 3111c in the opening regions of the pixel defining layer. The vertical projections of the third electrode portions 3111c on the substrate 10 may overlap the vertical projections of the first vias 611 on the substrate 10.

Optionally, the organic light-emitting units 30 in a same light-emitting unit group may be connected to the same scan and data line. At least one organic light-emitting unit 30 in the same light-emitting unit group may ensure that the anodes 311 in the opening region of the pixel defining layer may correspond to the source and drain electrodes of the drive circuits 20. However, the anodes 311 in the opening region of the pixel defining layer of may be misaligned from the source and drain electrodes of the drive circuits 20 electrically connected to the anodes 311 in at least one organic light-emitting unit 30 of the same light-emitting group, and the vias 61 corresponding to the anodes 311 which are misaligned from the source and drain electrodes of the drive circuits 20 may be used as the first vias 611. Optionally, the anodes 311 in the opening regions of the pixel defining layer of at least one organic light-emitting unit 30 may be required to be misaligned from the source and drain electrodes of the drive circuits 20 electrically connected to the anode 311. Therefore, at least the portion of the anodes 311 may include the electrode portions in the opening regions of the pixel defining layer and the connecting portions connected to the electrode portions; the vertical projections of the connecting portions on the substrate 10 may overlap the vertical projections of the vias 61 on the substrate 10; and the electrode portions may be connected to the source and drain electrodes of the corresponding drive circuits through the connecting portions and the vias.

The first electrode portions 3111*a* of the red organic light-emitting units 30R may be configured to be electrically connected to the corresponding drive circuits 20 through the first connecting portions 3112*a* and the first vias 611; and direction components, along the first direction, of the first vias 611 corresponding to the red organic light-emitting units 30R pointing to the corresponding electrically-connected first electrode portions 3111*a* may be opposite components. The third electrode portions 3111*c* of the blue organic light-emitting units 30B may be electrically connected to the corresponding drive circuits 20 through the third connecting portions 3112*c* and the first vias 611; and direction components, along the first direction, of the first vias 611 corresponding to the blue organic light-emitting units 30B pointing to the corresponding electrically-connected first electrode portions 3111*a* may be opposite components. In such way, it may ensure that the drive circuits 20 corresponding to the red organic light-emitting units 30R and the blue organic light-emitting units 30B may not be compressed extensively toward the first direction or the opposite direction of the first direction when compressing along the first direction and may not have the extreme situation that the drive circuits 20 may be completely located in the coverage regions of the anodes 311 of the other organic light-emitting units 30, and the first connecting portions 3112*a* and the third connecting portions 3112*c* may not be too long, thereby ensuring relatively small impact on the other organic light-emitting units 30 and the desirable display effect.

Furthermore, the red organic light-emitting units 30R, the green organic light-emitting units 30G, and the blue organic light-emitting units 30B may be arranged sequentially and repeatedly along the first direction and may be adjacent to one another along the second direction (the Y direction in FIG. 5). The organic light-emitting units 30 at the two adjacent rows may intersect along the second direction. Any adjacent light-emitting units selected from the red organic light-emitting units 30R, the green organic light-emitting units 30G, and the blue organic light-emitting units 30B may be arranged in a triangle. Therefore, the red organic light-emitting units 30R, the green organic light-emitting units 30G and the blue organic light-emitting units 30B may be ensured to be arranged in an equilateral triangle, and more organic light-emitting units may be ensured to be disposed in the display panel, which may improve the pixel resolution of the display panel.

Figure 7:
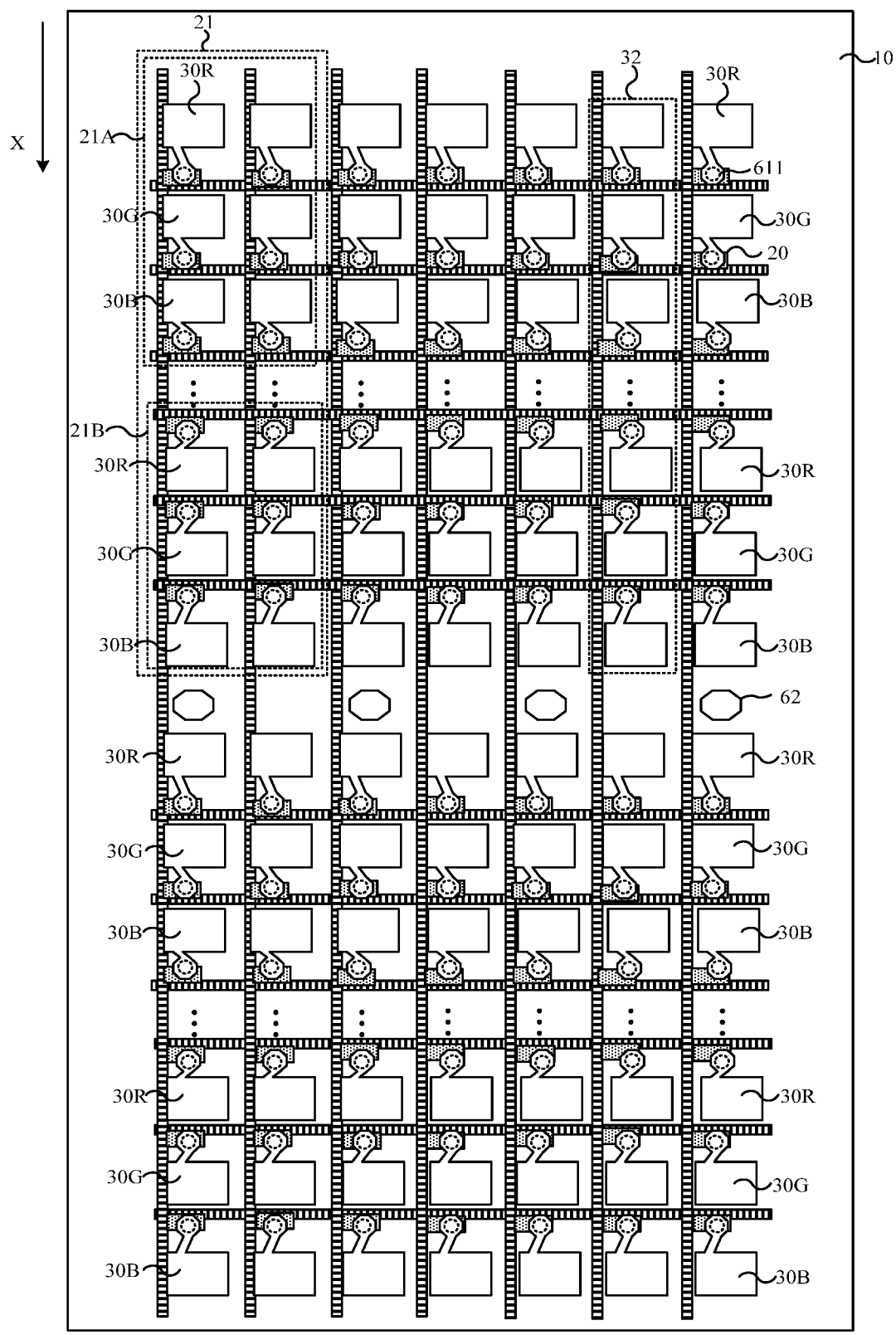
FIG. 7 illustrates a top-view schematic of another exemplary display panel according to embodiments of the present disclosure.
Figure 8:
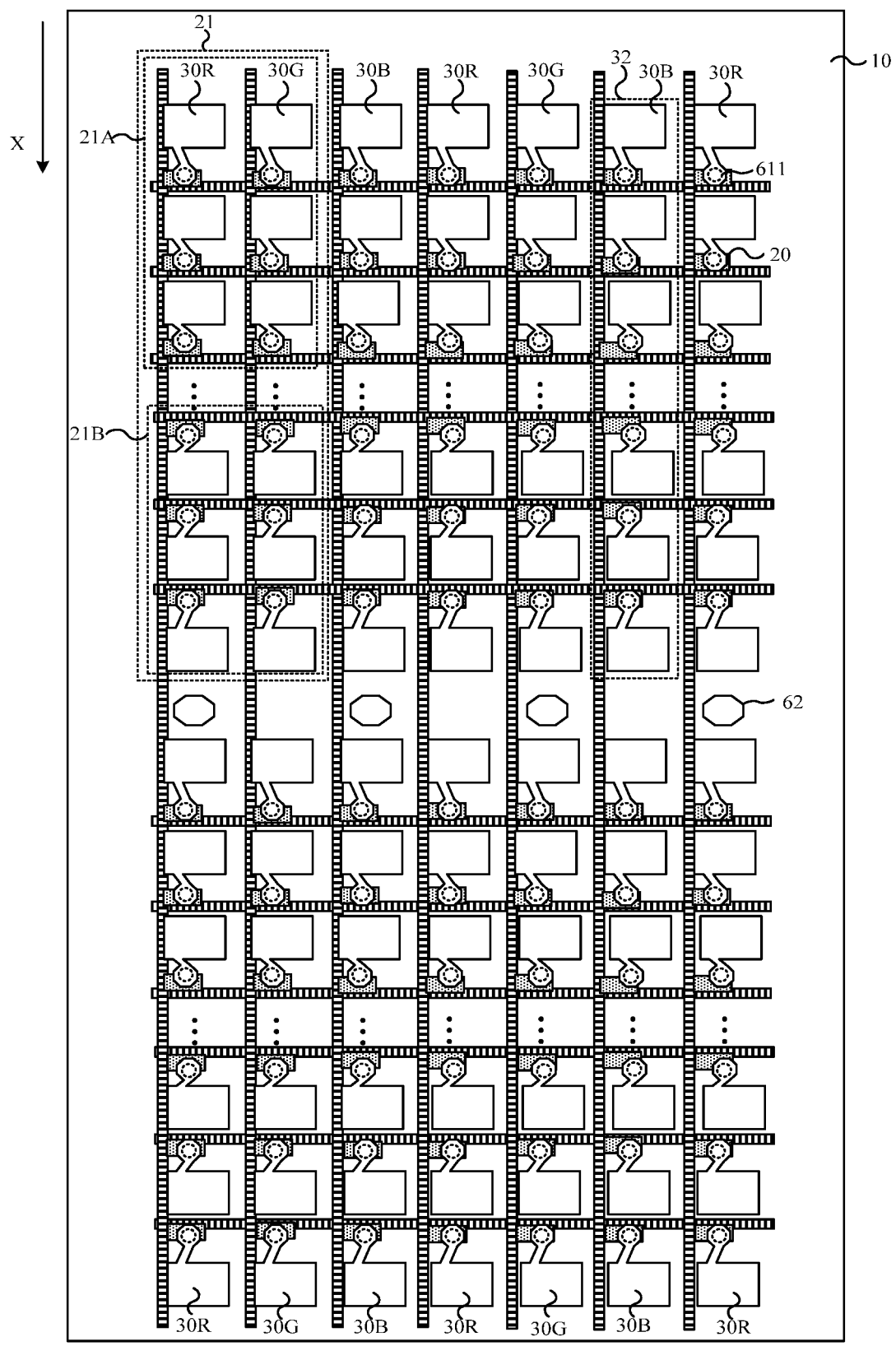
FIG. 8 illustrates a top-view schematic of another exemplary display panel according to embodiments of the present disclosure.

FIG. 7 illustrates a top-view schematic of another exemplary display panel according to embodiments of the present disclosure. As shown in FIG. 7, the organic light-emitting units 30 may include the red organic light-emitting units 30R, the green organic light-emitting units 30G, and the blue organic light-emitting units 30B. The red organic light-emitting units 30R, the green organic light-emitting units 30G, and the blue organic light-emitting units 30B may be arranged sequentially and repeatedly along the first direction. Along the second direction, the red organic light-emitting units 30R may be adjacent to one another; the green organic light-emitting units 30G may be adjacent to one another; and the blue organic light-emitting units 30B may be adjacent to one another. The first direction may intersect the second direction. Any adjacent light-emitting units selected from the red organic light-emitting units 30R, the green organic light-emitting units 30G, and the blue organic light-emitting units 30B may be arranged sequentially along the first direction. FIG. 8 illustrates a top-view schematic of another exemplary display panel according to embodiments of the present disclosure. As shown in FIG. 8, the organic light-emitting units 30 may include the red organic light-emitting units 30R, the green organic light-emitting units 30G, and the blue organic light-emitting units 30B. Along the first direction, the red organic light-emitting units 30R may be adjacent to one another; the green organic light-emitting units 30G may be adjacent to one another; and the blue organic light-emitting units 30B may be adjacent to one another. The red organic light-emitting units 30R, the green organic light-emitting units 30G, and the blue organic light-emitting units 30B may be arranged sequentially and repeatedly along the second direction. The first direction may intersect the second direction. Any adjacent light-emitting units selected from the red organic light-emitting units 30R, the green organic light-emitting units 30G, and the blue organic light-emitting units 30B may be arranged sequentially along the second direction.

As shown in FIG. 7 and FIG. 8, all of the anodes 311 of the red organic light-emitting units 30R, the green organic light-emitting units 30G, and the blue organic light-emitting units 30B may be electrically connected to the corresponding drive circuits 20 through the first vias 611. For example, the anodes 311 of the red organic light-emitting units 30R may include fourth electrode portions 3111*d* in the opening regions of the pixel defining layer and fourth connecting portions 3112*d* connected to the fourth electrode portions 3111*d*; and the vertical projections of the fourth connecting portions 3112*d* on the substrate 10 may overlap the vertical projections of the first vias 611 on the substrate 10. The anodes 311 of the green organic light-emitting units 30G may include fifth electrode portions 3111*e* in the opening regions of the pixel defining layer and fifth connecting portions 3112*e* connected to the fifth electrode portions 3111*e*; and the vertical projections of the fifth connecting portions 3112*e* on the substrate 10 may overlap the vertical projections of the first vias 611 on the substrate 10. The anodes 311 of the blue organic light-emitting units 30B may include sixth electrode portions 3111*f* in the opening regions of the pixel defining layer and sixth connecting portions 3112*f* connected to the sixth electrode portions 3111*f*; and the vertical projections of the sixth connecting portions 3112*f* on the substrate 10 may overlap the vertical projections of the first vias 611 on the substrate 10.

Furthermore, the anodes 311 arranged along the first direction and the regions between the two adjacent anodes 311 may constitute the anode coverage regions 32. The vertical projections of the first vias 611 on the substrate 10 may be within the vertical projections of the anode coverage regions 32 on the substrate 10. The first direction component, along the first direction, of each of the first vias 611 that correspond to the first drive circuit 21A pointing to a corresponding electrically-connected anode 311, and the second direction component, along the first direction, of each of the first vias 611 that correspond to the second drive circuit 21B pointing to a corresponding electrically-connected anode, are opposite components, When compressing the drive circuit group 21, it may ensure that the drive circuits 20 at the initial position may be compressed toward the drive circuits 20 at the ending position, and the drive circuits 20 at the ending position may be compressed toward the drive circuits 20 at the initial position, that is, the entire drive circuit group 21 may be compressed approximately toward the center position of the drive circuit group 21. The misalignment degree between the drive circuits 20 at the initial position and at the ending position of the drive circuit group 21 and the corresponding anodes 311 of the organic light-emitting units 30 may be ensured to be small, and the vias 61 may be partially or not be located in the coverage regions of the other anodes 311 when the drive circuits 20 are electrically connected to the anodes 311 of the corresponding organic light-emitting units 30; or the connecting portions may be short when the anodes 311 in the openings of the pixel defining layer are connected to the corresponding drive circuits 20, and the connecting portions may be partially or not be located in the coverage regions of the other anodes 311, thereby ensuring the influence reduction of the drive circuit compression. In addition, compressing the entire drive circuit group 21 approximately toward the center position of the drive circuit group 21 may ensure that the area reduction of the opening regions at the initial position and the ending position caused by the compression of the drive circuits 20 may be evenly distributed in the organic light-emitting units corresponding to the entire drive circuit group 21, thereby ensuring the desirable display effect.

Referring to FIG. 7 and FIG. 8, the extending lengths of the fourth connecting portions 3112d, the fifth connecting portions 3112e and the sixth connecting portions 3112f along the second direction may be same, thereby ensuring the display panel to have regular design and even display.

Optionally, referring to FIG. 4, a length of each drive circuit 20 in the drive circuit group 21 may be L1 along the first direction (the X direction in FIG. 3), where 45 µm<L1<50 µm. A length of the drive circuit group 21 may be L2, where 300 µm<L2<1000 A distance between the two adjacent drive circuit groups 21 may be L3, where 20 µm<L3<50 µm.

The length of the drive circuits 20 may be understood as a length from an initial position of one drive circuit 20 to an initial position of an adjacent drive circuit 20. The length of the drive circuit group 21 may be understood as a length from an initial position of the first drive circuit 20 and an ending position of the last drive circuit 20 in the entire drive circuit group 21. The distance between the adjacent drive circuit groups 21 may be understood as a length from an ending position of the last drive circuit 20 in a previous drive circuit group 21 to an initial position of the first drive circuit 20 in an adjacent drive circuit group 21, which may be the disposing space for the imaging apertures 62. By appropriately configuring the length of the drive circuits 20 and the length of the drive circuit group 21, a proper number of the drive circuits 20 may be ensured to be configured in each drive circuit group 21, and a proper distance between the two adjacent drive circuit groups 21 may be obtained when compressing the drive circuits 20, which may reserve space for disposing the imaging apertures 62.

Referring to FIG. 4, the light-blocking layer 40 may be between the drive circuits 20 and the organic light-emitting units 30. Currently, the vias 61 and the imaging apertures 62 may be formed in a same preparation process, and the vias 61 may be connected to the imaging apertures 62, which may ensure that the preparation process of the vias 61 and the imaging apertures 62 is simple.

Optionally, the light-blocking layer 40 may be a metal light-blocking layer. In addition to forming the vias 61 and the imaging apertures 62, the light-blocking layer 40 may be connected to a PVDD voltage signal. In such way, both the light-blocking layer and the film layer having the data lines may be connected to the PVDD voltage signal, and the light-blocking layer and the film layer having the data lines may form a parallel relationship, which may reduce the PVDD signal loss during the transmission process and improve the light-emitting efficiency of the display panel.

Optionally, the substrate 10 provided by the embodiments of the present disclosure may be a flexible substrate including a first flexible substrate and a second flexible substrate (not shown). The light-blocking layer 40 may be between the first flexible substrate and the second flexible substrate. The light-blocking layer 40 may be prepared using a simple process and may not form a coupling capacitance with the drive circuits 20 or the organic light-emitting units 30, which may ensure relatively small interferences of the display signal in the display panel and also the desirable display effect.

Referring to FIG. 4, the display panel provided by the embodiments of the present disclosure may include a first passivation layer 91, a second passivation layer 92 and a planarization layer 93 sequentially located between the film layer having the drive circuits 20 and the film layer having the organic light-emitting units 30. The first passivation layer 91 may be an inorganic layer, and the second passivation layer 92 and the planarization layer 93 may include organic layers. The vias 61 may pass through the first passivation layer 91, the second passivation layer 92 and the planarization layer 93, so a first opening 94 may be formed in the first passivation layer 91; a second opening 95 may be formed in the second passivation layer 92; and a third opening 96 may be formed in the planarization layer 93. An area S4 of the first opening 94, an area S5 of the second opening 95 and an area S6 of the third opening 96 may meeting the requirement that S4>S5 and S5=S6.

As shown in FIG. 4, by configuring the first passivation layer 91 and the second passivation layer 92 between the drive circuits 20 and the light-blocking layer 40, the coupling capacitance between the film layer of the source and the light-blocking layer 40 may be reduced, which may have small influence on the display signal and ensure the desirable display effect of the display panel. Meanwhile, the first passivation layer 91 may be an inorganic layer, so the cross-section of the first opening 94 may be rough when forming the first opening 94, which may affect the connection between the anodes and the drive circuits 20. The area S4 of the first opening 94 may be configured to be greater than the area S5 of the second opening 95. When preparing the second passivation layer 92, the organic material used by the second passivation layer 92 may be deposited onto the cross-section of the first opening 94, which may ensure the smooth cross-section of the first opening 94 and the desirable connection between the anodes and the drive circuits 20.

Optionally, in the display panel provided by the embodiments of the present disclosure, the organic light-emitting units 30 may be light sources of the fingerprint recognition units 50, which may ensure that light sources may not be needed to be configured for the fingerprint recognition units 50 in the display panel. In such way, the structure of the display panel and the film layer relationship may be simple, and the light-weight design of the display panel may be easily implemented. Or the display panel provided by the embodiments of the present disclosure may include fingerprint recognition light sources (not shown). The fingerprint recognition units 50 may be separately provided with light sources through the fingerprint recognition light sources, which may ensure that the fingerprint recognition unit 50 may have a plurality of functions. For example, the fingerprint recognition light sources may be infrared light sources. In addition to the fingerprint recognition, the fingerprint recognition units 50 may identify the blood flow condition of the human body and also monitor human health.

Figure 9:
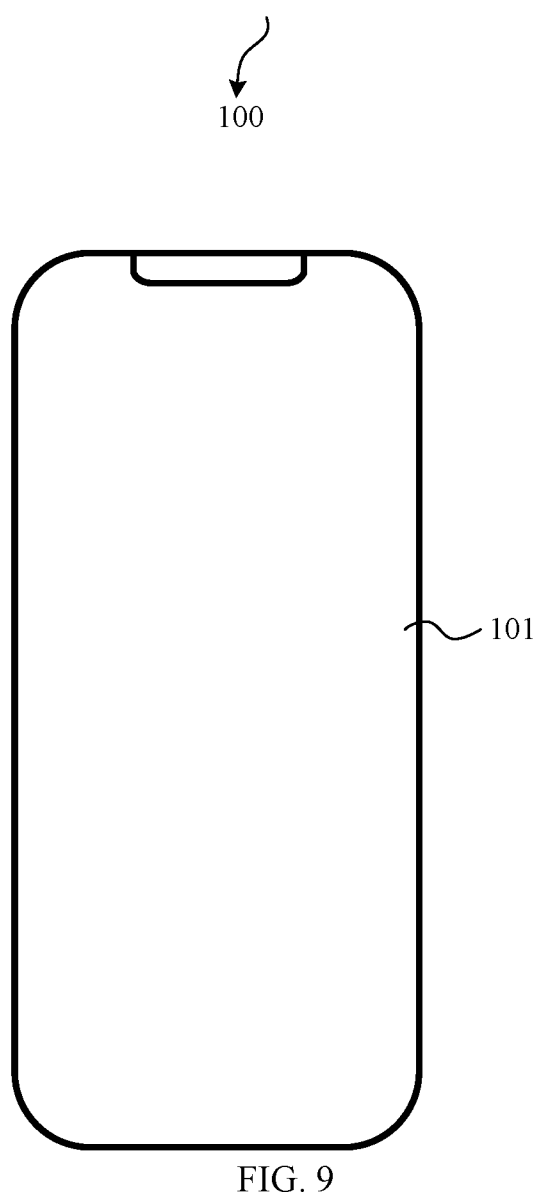
FIG. 9 illustrates a schematic of an exemplary display device according to embodiments of the present disclosure.

A display device may also be provided in the embodiments of the present disclosure. FIG. 9 illustrates a schematic of an exemplary display device according to embodiments of the present disclosure. A display device 100 provided in the embodiments of the present disclosure may include the display panel 101 according to various embodiments of the present disclosure. Optionally, the display device provided in the embodiments of the present disclosure may be a mobile phone in FIG. 9, and also may be a computer, a television, a smart wearable display device, and the like, which may not be limited in various embodiments of the present disclosure.

From the above-mentioned embodiments, it can be seen that the display panel and the display device provided by the present disclosure may achieve at least the following beneficial effects.

For the display panel and the display device provided by the present disclosure, the drive circuits may be divided into the plurality of drive circuit groups; the distance between the two adjacent drive circuits in the drive circuit group may be configured to be less than the distance between the two adjacent drive circuits in the two adjacent drive circuit groups along the first direction; and the imaging aperture may be disposed between two adjacent drive circuits. Furthermore, a first direction component, along the first direction, of each of vias that correspond to the first drive circuit at an initial position in one drive circuit group pointing to a corresponding electrically-connected anode, and a second direction component, along the first direction, of each of vias that correspond to the second drive circuit at an ending position in the one drive circuit group pointing to a corresponding electrically-connected anode, are opposite components. In such way, when the first drive circuit at the initial position in the drive circuit group is electrically connected to the anodes of the corresponding organic light-emitting units and the second drive circuit at the ending position in the drive circuit group is electrically connected to the anodes of the corresponding organic light-emitting units, it may ensure that the area reduction of the opening regions caused by the vias may be evenly distributed in the organic light-emitting units corresponding to the entire drive circuit group, thereby ensuring the desirable display effect.

Note that the above-mentioned are only the preferred embodiments of the present disclosure and the technical principles applied thereto. Those skilled in the art will appreciate that the present disclosure is not limited to the embodiments described herein, and that the features of various embodiments of the present disclosure may be coupled or combined in part or in whole and may cooperate with each other. It will be apparent to those skilled in the art that various modifications, changes, and combinations and substitutions can be made without departing from the scope of the disclosure. Therefore, the present disclosure has been described in detail by the above-mentioned embodiments, but the present disclosure is not limited to the above-mentioned embodiments, and other equivalent embodiments may be included without departing from the inventive concept. The scope of the present disclosure is defined by the appended claims and their equivalents.

What is claimed is:

1. A display panel, comprising:
   a substrate, a plurality of drive circuits, and a plurality of organic light-emitting units, which are stacked sequentially, wherein:
   the plurality of drive circuits and the plurality of organic light-emitting units are electrically connected in a one-to-one correspondence, and anodes of the plurality of organic light-emitting units are electrically connected to the drive circuits through vias;
   the plurality of drive circuits is divided into a plurality of drive circuit groups, wherein each drive circuit group includes multiple drive circuits arranged in an array, and the anodes of the plurality of organic light-emitting units are evenly arranged; and
   a distance between two adjacent drive circuits in each drive circuit group is less than a distance between two adjacent drive circuits in two adjacent drive circuit groups along a first direction; the drive circuit group includes M rows of the drive circuits along the first direction, wherein the drive circuits from a first row to an i-th row is a first drive circuit, the drive circuits from a j-th row to an M-th row is a second drive circuit, and $1 \leq i < j \leq M$; a first direction component, along the first direction, of each of vias that correspond to at least a portion of the first drive circuit pointing to a first corresponding electrically-connected anode, and a second direction component, along the first direction, of each of vias that correspond to at least a portion of the second drive circuit pointing to a second corresponding electrically-connected anode, are opposite components; and the first direction is a row direction or a column direction of the drive circuits arranged in an array; and
   a light-blocking layer and a plurality of fingerprint recognition units, wherein a plurality of imaging apertures is formed at the light-blocking layer; vertical projections of the imaging apertures on a film layer having the plurality of drive circuits are between the two adjacent drive circuit groups; the fingerprint recognition units are on a side of the light-blocking layer away from the organic light-emitting units; and light reflected by a touch body enters the fingerprint recognition units through the imaging apertures.

2. The display panel according to claim 1, wherein:
at least a portion of the anodes include electrode portions in opening regions of a pixel defining layer and connecting portions connected to the electrode portions; vertical projections of the connecting portions on the substrate cover vertical projections of the vias on the substrate; and the connecting portions are electrically connected to the drive circuits through the vias; and
the drive circuit group further includes a third drive circuit between a first drive circuit and a second drive circuit along the first direction; a tilt degree of the connecting portions corresponding to the third drive circuit with respect to the first direction is greater than a tilt degree of the connecting portions corresponding to the first drive circuit with respect to the first direction; and a tilt degree of the connecting portions corresponding to the third drive circuit with respect to the first direction is greater than a tilt degree of the connecting portions corresponding to the second drive circuit with respect to the first direction.

3. The display panel according to claim 2, wherein:
misalignment degree between the drive circuits from the 1st row to the i-th row in the first drive circuit and electrically-connected anodes thereof is gradually reduced along the first direction; and
misalignment degree between the drive circuits from the j-th row to the M-th row in the first drive circuit and electrically-connected anodes thereof is gradually increased along the first direction.

4. The display panel according to claim 1, wherein:
at least a portion of the anodes include electrode portions in opening regions of a pixel defining layer and connecting portions connected to the electrode portions, and the connecting portions of the anodes are electrically connected to the drive circuits through the vias; and in each drive circuit group, the connecting portions corresponding to at least the portion of the first drive circuit and the connecting portions corresponding to at least the portion of the second drive circuit are symmetrical along a first center-line of the drive circuit group, wherein the first center-line is perpendicular to the first direction.

5. The display panel according to claim 1, wherein:
the vias include first vias; the anodes arranged along the first direction and regions between two adjacent anodes along the first direction constitute anode coverage regions; vertical projections of the first vias on the substrate are within vertical projections of the anode coverage regions on the substrate; and
the first direction component, along the first direction, of each of the first vias that correspond to at least the portion of the first drive circuit pointing to the first corresponding electrically-connected anode, and the second direction component, along the first direction, of each of the first vias that correspond to at least the portion of the second drive circuit pointing to the second corresponding electrically-connected anode, are opposite components.

6. The display panel according to claim 5, wherein:
the first drive circuit at least includes first anodes and second anodes along the first direction; the first anodes are on a side of the second anodes away from the second drive circuit; first notch regions are on a side of the second anodes adjacent to the first anodes; and vertical projections of the first vias corresponding to the first anodes on the substrate overlap vertical projections of the first notch regions on the substrate; and
the second drive circuit at least includes third anodes and fourth anodes along the first direction; the third anodes are on a side of the fourth anodes away from the first drive circuit; second notch regions are on a side of the fourth anodes adjacent to the third anodes; and vertical projections of the first vias corresponding to the third anodes on the substrate overlap vertical projections of the second notch regions on the substrate.

7. The display panel according to claim 1, wherein:
vertical projections of the drive circuits on the substrate are between vertical projections of two adjacent rows of the anodes on the substrate along a direction perpendicular to the first direction.

8. The display panel according to claim 1, wherein:
the organic light-emitting units include red organic light-emitting units, green organic light-emitting units, and blue organic light-emitting units; the red organic light-emitting units, the green organic light-emitting units and the blue organic light-emitting units are arranged sequentially and repeatedly along the first direction; along a second direction, the red organic light-emitting units are configured to be adjacent to one another; the green organic light-emitting units are configured to be adjacent to one another; and the blue organic light-emitting units are configured to be adjacent to one another; any adjacent light-emitting units selected from the red organic light-emitting units, the green organic light-emitting units, and the blue organic light-emitting units are arranged in a triangle shape; and the first direction intersects the second direction;
the vias include first vias and second vias; the anodes arranged along the first direction and regions between two adjacent anodes along the first direction constitute anode coverage regions; vertical projections of the first vias on the substrate are within vertical projections of the anode coverage regions on the substrate; vertical projections of the second vias on the substrate are outside of the vertical projections of the anode coverage regions on the substrate; and
anodes of the red organic light-emitting units are electrically connected to the drive circuits through the first vias; anodes of the green organic light-emitting units are electrically connected to the drive circuits through the second vias; and anodes of the blue organic light-emitting units are electrically connected to the drive circuits through the first vias.

9. The display panel according to claim 8, further including:
a plurality of scan lines extending along the first direction and a plurality of data lines extending along the second direction, wherein:
the drive circuits, corresponding to at least one group of the red organic light-emitting unit, the green organic light-emitting unit and the blue organic light-emitting unit, which are arranged in the triangle shape, are sequentially arranged along a direction of the scan lines; and
the drive circuits are connected to a same scan line and connected to different data lines respectively.

10. The display panel according to claim 9, wherein:
the anodes of the red organic light-emitting units include first electrode portions in opening regions of a pixel defining layer and first connecting portions connected to the first electrode portions; and vertical projections of the first connecting portions on the substrate overlap the vertical projections of the first vias on the substrate;
the anodes of the green organic light-emitting units include second electrode portions in the opening regions of the pixel defining layer and second connecting portions connected to the second electrode portions; and vertical projections of the second connecting portions on the substrate overlap the vertical projections of the second vias on the substrate; and
the anodes of the blue organic light-emitting units include third electrode portions in the opening regions of the pixel defining layer; and vertical projections of the third electrode portions on the substrate overlap the vertical projections of the first vias on the substrates.

11. The display panel according to claim 1, wherein:
the organic light-emitting units include red organic light-emitting units, green organic light-emitting units, and blue organic light-emitting units; the red organic light-emitting units, the green organic light-emitting units, and the blue organic light-emitting units are arranged sequentially and repeatedly along the first direction; along a second direction, the red organic light-emitting units are configured to be adjacent to one another, the green organic light-emitting units are configured to be adjacent to one another, and the blue organic light-emitting units are configured to be adjacent to one another; the first direction intersects the second direction; and any adjacent light-emitting units selected from the red organic light-emitting units, the green organic light-emitting units, and the blue organic light-emitting units are arranged sequentially along the first direction.

12. The display panel according to claim 1, wherein:
the organic light-emitting units include red organic light-emitting units, green organic light-emitting units, and blue organic light-emitting units; along the first direction, the red organic light-emitting units are configured to be adjacent to one another, the green organic light-emitting units are configured to be adjacent to one another, and the blue organic light-emitting units are configured to be adjacent to one another; the red organic light-emitting units, the green organic light-emitting units, and the blue organic light-emitting units are arranged sequentially and repeatedly along the second direction; the first direction intersects the second direction; and any adjacent light-emitting units selected from the red organic light-emitting units, the green organic light-emitting units, and the blue organic light-emitting units are arranged sequentially along the second direction.

13. The display panel according to claim 11, wherein:
all of the vias are first vias, and the anodes arranged along the first direction and regions between two adjacent anodes along the first direction constitute anode coverage regions; vertical projections of the first vias on the substrate are within vertical projections of the anode coverage regions on the substrate; and
the first direction component, along the first direction, of each of the first vias that correspond to the first drive circuit pointing to the first corresponding electrically-connected anode, and the second direction component, along the first direction, of each of the first vias that correspond to the second drive circuit pointing to the second corresponding electrically-connected anode, are opposite components.

14. The display panel according to claim 13, wherein:
anodes of the red organic light-emitting units include fourth electrode portions in opening regions of a pixel defining layer and fourth connecting portions connected to the fourth electrode portions; and vertical projections of the fourth connecting portions on the substrate overlap vertical projections of the first vias on the substrate;
anodes of the green organic light-emitting units include fifth electrode portions in the opening regions of the pixel defining layer and fifth connecting portions connected to the fifth electrode portions; and vertical projections of the fifth connecting portions on the substrate overlap the vertical projections of the first vias on the substrate; and
anodes of the blue organic light-emitting units include sixth electrode portions in the opening regions of the pixel defining layer and sixth connecting portions connected to the sixth electrode portions; and vertical projections of the sixth connecting portions on the substrate overlap the vertical projections of the first vias on the substrate.

15. The display panel according to claim 14, wherein:
extending lengths of the fourth connecting portions, the fifth connecting portions and the sixth connecting portions along the second direction are the same.

16. The display panel according to claim 12, wherein:
all of the vias are first vias, and the anodes arranged along the first direction and regions between two adjacent anodes along the first direction constitute anode coverage regions; vertical projections of the first vias on the substrate are within vertical projections of the anode coverage regions on the substrate; and
the first direction component, along the first direction, of each of the first vias that correspond to the first drive circuit pointing to the first corresponding electrically-connected anode, and the second direction component, along the first direction, of each of the first vias that correspond to the second drive circuit pointing to the second corresponding electrically-connected anode, are opposite components.

17. The display panel according to claim 16, wherein:
anodes of the red organic light-emitting units include fourth electrode portions in opening regions of a pixel defining layer and fourth connecting portions connected to the fourth electrode portions; and vertical projections of the fourth connecting portions on the substrate overlap vertical projections of the first vias on the substrate;
anodes of the green organic light-emitting units include fifth electrode portions in the opening regions of the pixel defining layer and fifth connecting portions connected to the fifth electrode portions; and vertical projections of the fifth connecting portions on the substrate overlap the vertical projections of the first vias on the substrate; and
anodes of the blue organic light-emitting units include sixth electrode portions in the opening regions of the pixel defining layer and sixth connecting portions connected to the sixth electrode portions; and vertical projections of the sixth connecting portions on the substrate overlap the vertical projections of the first vias on the substrate, wherein extending lengths of the fourth connecting portions, the fifth connecting portions and the sixth connecting portions along the second direction are the same.

18. The display panel according to claim 1, wherein along the first direction:
a length of each drive circuit in the drive circuit group is L1, wherein 45 µm<L1<50 µm;
a length of the drive circuit group is L2, wherein 300 µm<L2<1000 µm; and
a distance between the two adjacent drive circuit groups is L3, wherein 20 µm<L3<50 µm.

19. The display panel according to claim 1, wherein:
the light-blocking layer is between the drive circuits and the organic light-emitting units, and
the imaging apertures are connected to the vias adjacent to the imaging apertures.

20. A display device, comprising:
a display panel, comprising:
a substrate, a plurality of drive circuits, and a plurality of organic light-emitting units, which are stacked sequentially, wherein:
the plurality of drive circuits and the plurality of organic light-emitting units are electrically connected in a one-to-one correspondence, and anodes of the plurality of organic light-emitting units are electrically connected to the drive circuits through vias;
the plurality of drive circuits is divided into a plurality of drive circuit groups, wherein each drive circuit group includes multiple drive circuits arranged in an array, and the anodes of the plurality of organic light-emitting units are evenly arranged; and
a distance between two adjacent drive circuits in each drive circuit group is less than a distance between two adjacent drive circuits in two adjacent drive circuit groups along a first direction; the drive circuit group includes M rows of the drive circuits along the first direction, wherein the drive circuits from a first row to an i-th row is a first drive circuit, the drive circuits from a j-th row to an M-th row is a second drive circuit, and $1 \le i < j \le M$; a first direction component, along the first direction, of each of vias that correspond to at least a portion of the first drive circuit pointing to a first corresponding electrically-connected anode, and a second direction component, along the first direction, of each of vias that correspond to at least a portion of the second drive circuit pointing to a second corresponding electrically-connected anode, are opposite components; and the first direction is a column direction of the drive circuits arranged in an array; and a light-blocking layer and a plurality of fingerprint recognition units, wherein a plurality of imaging apertures is formed at the light-blocking layer; vertical projections of the imaging apertures on a film layer having the plurality of drive circuits are between the two adjacent drive circuit groups; the fingerprint recognition units are on a side of the light-blocking layer away from the organic light-emitting units; and light reflected by a touch body enters the fingerprint recognition units through the imaging apertures, wherein:

the display device is one of a mobile phone, a computer, a television, or a smart wearable display device.

* * * * *